US010746831B2

(12) United States Patent
Pipe

(10) Patent No.: US 10,746,831 B2
(45) Date of Patent: Aug. 18, 2020

(54) SYSTEM AND METHOD FOR CONVOLUTION OPERATIONS FOR DATA ESTIMATION FROM COVARIANCE IN MAGNETIC RESONANCE IMAGING

(71) Applicant: DIGNITY HEALTH, San Francisco, CA (US)

(72) Inventor: James G. Pipe, Phoenix, AZ (US)

(73) Assignee: Dignity Health, San Francisco, CA (US)

(*) Notice: Subject to any disclaimer, the term of this patent is extended or adjusted under 35 U.S.C. 154(b) by 685 days.

(21) Appl. No.: 15/519,997

(22) PCT Filed: Oct. 21, 2015

(86) PCT No.: PCT/US2015/056639
§ 371 (c)(1),
(2) Date: Apr. 18, 2017

(87) PCT Pub. No.: WO2016/064990
PCT Pub. Date: Apr. 28, 2016

(65) Prior Publication Data
US 2017/0336488 A1 Nov. 23, 2017

Related U.S. Application Data

(60) Provisional application No. 62/066,662, filed on Oct. 21, 2014.

(51) Int. Cl.
*G01R 33/561* (2006.01)
*G01R 33/48* (2006.01)
(Continued)

(52) U.S. Cl.
CPC ........ *G01R 33/5611* (2013.01); *G01R 33/482* (2013.01); *G01R 33/4824* (2013.01); *G01R 33/5608* (2013.01); *G01V 3/14* (2013.01)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS

2004/0227512 A1* 11/2004 Twieg .................. G01R 33/561
324/309
2006/0256845 A1* 11/2006 Durand .................... H04B 1/30
375/152

(Continued)

OTHER PUBLICATIONS

Klaas P. Pruessmann, Encoding and Reconstruction in Parallel MRI, 19 NMR in Biomed. 288-299 (Wiley, Mar. 2006) (Year: 2006).*

(Continued)

*Primary Examiner* — Tung X Nguyen
*Assistant Examiner* — Robert P Alejnikov, Jr.
(74) *Attorney, Agent, or Firm* — Quarles & Brady LLP

(57) ABSTRACT

Described here are systems and methods for reconstructing images of a subject using a magnetic resonance imaging ("MRI") system. As part of the reconstruction, synthesized data are estimated at arbitrarily specified k-space locations from measured data at known k-space locations. In general, the synthesized data is estimated using a convolution operation that is based on measured or estimated covariances in the acquired data. The systems and methods described here can thus be referred to as Convolution Operations for Data Estimation from Covariance ("CODEC").

22 Claims, 2 Drawing Sheets

(51) Int. Cl.
*G01V 3/14* (2006.01)
*G01R 33/56* (2006.01)

(58) Field of Classification Search
CPC ............ G01R 33/4826; G01R 33/4828; G01R 33/483; G01R 33/4831; G01R 33/4833; G01R 33/4835; G01R 33/4836; G01R 33/4838; G01R 33/5602; G01R 33/5617
USPC ........................................................ 324/309
See application file for complete search history.

(56) References Cited

U.S. PATENT DOCUMENTS

| | | | |
|---|---|---|---|
| 2008/0154115 A1* | 6/2008 | Fuderer | G01R 33/5611 |
| | | | 600/410 |
| 2008/0240533 A1* | 10/2008 | Piron | G01R 33/482 |
| | | | 382/131 |
| 2009/0285463 A1* | 11/2009 | Otazo | G06T 3/4053 |
| | | | 382/131 |
| 2010/0264923 A1* | 10/2010 | Heberlein | G01R 33/5611 |
| | | | 324/309 |
| 2011/0286648 A1* | 11/2011 | Sharif | G01R 33/5611 |
| | | | 382/131 |
| 2013/0181711 A1* | 7/2013 | Chaari | G01R 33/5611 |
| | | | 324/309 |
| 2013/0265052 A1 | 10/2013 | Nickel | |
| 2013/0278256 A1* | 10/2013 | Ahmad | G01R 33/5611 |
| | | | 324/309 |

OTHER PUBLICATIONS

International Search Report and Written Opinion dated Jan. 21, 2016 for International Application No. PCT/US2015/056639.

* cited by examiner

SYSTEM AND METHOD FOR CONVOLUTION OPERATIONS FOR DATA ESTIMATION FROM COVARIANCE IN MAGNETIC RESONANCE IMAGING

CROSS-REFERENCE TO RELATED APPLICATIONS

This application represents the U.S. National Stage of International Application No. PCT/US2015/056639, filed Oct. 21, 2015 which is based on, claims priority to, and incorporates herein by reference in its entirety, U.S. Provisional Application No. 62/066,662, filed Oct. 21, 2014, and entitled, "CONVOLUTION OPERATIONS FOR DATA ESTIMATION FROM COVARIANCE IN MAGNETIC RESONANCE IMAGING."

BACKGROUND

The present disclosure relates to systems and methods for magnetic resonance imaging ("MRI"). More particularly, the present disclosure relates to systems and methods for reconstructing images from data acquired with an MRI system.

Magnetic resonance imaging ("MRI") uses the nuclear magnetic resonance ("NMR") phenomenon to produce images. When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. There are many other k-space sampling patterns used by MRI systems. These include "radial", or "projection reconstruction" scans in which k-space is sampled as a set of radial sampling trajectories extending from the center of k-space. There are also many k-space sampling methods that are closely related to the radial scan and that sample along a curved k-space sampling trajectory rather than the straight line radial trajectory.

Depending on the technique used, many MR scans currently require many minutes to acquire the necessary data used to produce medical images. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel MRI" ("pMRI"). Parallel MRI techniques use spatial information from arrays of radio frequency ("RF") receiver coils to substitute for the spatial encoding that would otherwise have to be obtained in a sequential fashion using RF pulses and magnetic field gradients, such as phase and frequency encoding gradients. Each of the spatially independent receiver coils of the array carries certain spatial information and has a different spatial sensitivity profile. This information is utilized in order to achieve a complete spatial encoding of the received MR signals, for example, by combining the simultaneously acquired data received from each of the separate coils.

The combination of the separate MR signals produced by the separate receiver coils enables a reduction of the acquisition time required for an image, in comparison to a conventional k-space data acquisition, by a factor related to the number of the receiver coils. Thus the use of multiple receiver coils acts to multiply imaging speed, without increasing gradient switching rates or RF power.

Two categories of parallel imaging techniques that have been developed and applied to in vivo imaging are so-called "image space methods" and "k-space methods." An example image space method is known in the art as sensitivity encoding ("SENSE"), while an example k-space method is known in the art as simultaneous acquisition of spatial harmonics ("SMASH"). With SENSE, the undersampled k-space data are first Fourier transformed to produce an aliased image from each coil, and then the aliased image signals are unfolded by a linear transformation of the superimposed pixel values. With SMASH, the omitted k-space lines are synthesized or reconstructed prior to Fourier transformation, by constructing a weighted combination of neighboring k-space lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as generalized autocalibrating partially parallel acquisitions ("GRAPPA"), as described, for example, in U.S. Pat. No. 6,841,998. With GRAPPA, k-space lines near the center of k-space are sampled at the Nyquist frequency, in comparison to the undersampling employed in the peripheral regions of k-space. These center k-space lines are referred to as the so-called autocalibration signal ("ACS") lines, which are used to determine the weighting factors that are utilized to synthesize, or reconstruct, the missing k-space lines. In particular, a linear combination of individual coil data is used to create the missing lines of k-space. The coefficients for the combination are determined by fitting the acquired data to the more highly sampled data near the center of k-space.

Reconstructing non-Cartesian parallel imaging scans by synthesizing unacquired k-space data from neighboring acquired data remains a computationally burdensome endeavor. It would therefore be desirable to provide a system and method capable of synthesizing k-space data from non-Cartesian acquisitions.

SUMMARY

The present disclosure overcomes the aforementioned drawbacks by providing a method for producing an image of a subject using a magnetic resonance imaging ("MRI") system, where the MRI system is used to acquire data from the subject using either one or multiple receive coils. Covariance maps are produced from the acquired data. The covariance maps define covariances, as a function of difference in k-space location, within the single receive coil or between all possible pairs of the multiple receive coils. Intermediate data are estimated using the acquired data and the produced covariance maps. A desired k-space sampling pattern is selected, and synthesized data are produced on this selected k-space sampling pattern by convolving the intermediate data with the covariance maps. An image of the subject is then reconstructed from at least the synthesized data, or combinations of the synthesized data with the acquired data.

In accordance with another aspect of the disclosure, a magnetic resonance imaging (MRI) system is provided that includes a magnet system configured to generate a polarizing magnetic field about at least a portion of a subject arranged in the MRI system and a plurality of gradient coils configured to apply a gradient field to the polarizing magnetic field. The MRI system also includes a radio frequency (RF) system configured to apply an excitation field to the subject and acquire MR image data therefrom and a computer system. The computer system is programmed to direct the MRI system to acquire data from the subject using multiple receive coils and produce covariance maps that define covariances of the acquired data as a function of differences of k-space locations between pairs of the multiple receive coils. The computer system is also programmed to select a desired k-space sampling pattern, produce synthesized data on the selected k-space sampling pattern by convolving an estimate formed from the acquired data with the covariance maps, and reconstruct an image of the subject from at least the synthesized data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
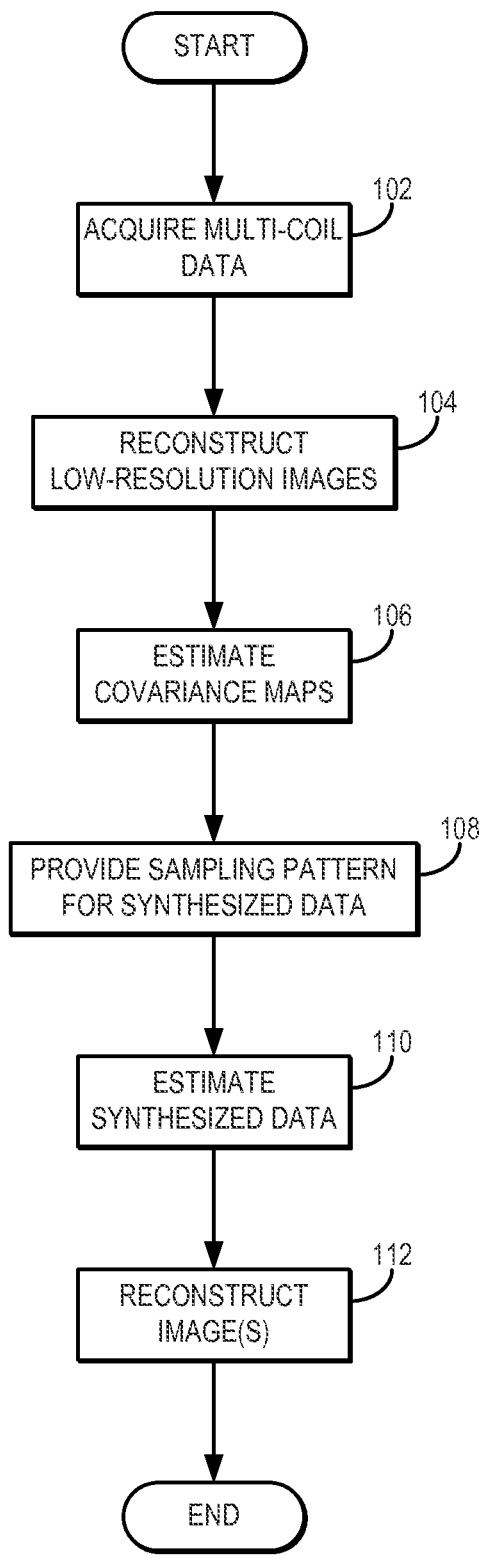
FIG. 1 is a flowchart setting forth the steps of an example method for producing an image of a subject using a magnetic resonance imaging ("MRI") system based on synthesized data that is estimated using convolution operations on covariance information.

Described here are systems and methods for reconstructing images of a subject using a magnetic resonance imaging ("MRI") system. As part of the reconstruction, data, $y_m$, can be estimated or otherwise synthesized at arbitrarily specified k-space locations from measured data, $x_n$, at known k-space locations. In general, the synthesized data are estimated using a convolution operation that is based on measured or estimated covariances in the acquired data. The systems and methods described here can thus be referred to as Convolution Operations for Data Estimation from Covariance ("CODEC").

Both the measured and synthesized data may correspond to one or more receive coils, either real or virtual. This method can be applied in a straightforward manner to data collected from, or synthesized onto, any type of trajectory. One general advantage of this class of methods is in reducing scan time by collecting a fraction of the desired data and estimating the rest; although, this class of methods could also be used for enforcing data consistency, or other purposes.

The systems and methods described here are advantageous for data synthesis for non-Cartesian imaging, which is currently achieved by two major approaches: GRAPPA (and its variants) and iterative SENSE. The general advantage of CODEC over GRAPPA is that CODEC does not require a fixed geometry between sampled and undersampled points and does not require training. The general advantage of CODEC over iterative SENSE is speed, as the iterations in the CG approach for iterative SENSE require gridding, FFT, IFFT, and degridding, while for CODEC require only a single convolution. It is contemplated that for 3D non-Cartesian imaging in particular, CODEC will be substantially faster and require far less memory than iterative SENSE.

The estimate of synthesized data can be framed as follows. Having sampled points $x_1, \ldots, x_n$ in k-space, it is desired to estimate a different point, $y_1$, with a linear combination, s, of the sampled points, $x_1, \ldots, x_n$. First, covariance can be defined as, $$r_{mn} = E[x_m x_n^*] \tag{1};$$

variance can be defined as, $$\sigma_n^2 = r^{nn} \tag{2};$$

and the correlation coefficient can be defined as, $$\rho_{mn} = \frac{r_{mn}}{\sigma_m \sigma_n}. \tag{3}$$

A conditional estimation based on correlation can be defined as follows:

$$\hat{x}_{min} \square E[x_m \mid x_n] = \rho_{mn} x_n \frac{\sigma_m}{\sigma_n}. \tag{4}$$

Letting, $$s = \sum_{n=1}^{N} c_n x_n = c^T x; \tag{5}$$

where c and x are vectors of the coefficients of $c_n$ and $x_n$, respectively, the correlation of s with $y_1$, which it is desired to maximize, can be calculated as, $$\rho_{ys} = \frac{E[y_1 s^*]}{\sigma_y \sigma_s} = \frac{\sum_n c_n^* r_{yn}}{\sigma_y \sqrt{E\left[\sum_n c_n x_n \sum_n c_n^* x_n^*\right]}} \tag{6}$$

-continued $$= \frac{\sum_n c_n^* r_{yn}}{\sigma_y \sqrt{\sum_m \sum_n c_m c_n^* r_{mn}}}$$

$$= \frac{c^H r_{yn}}{\sigma_y \sqrt{c^H R_{xx} c}};$$

where $r_{yn}$ is a vector of the covariances of $y_1$ and $x_n$, and $R_{xx}$ is the covariance matrix of the measured data, x. The correlation in Eqn. (6) is maximized using, $$\hat{c} = \frac{\sigma_y R_{xx}^{-1} r_{yn}}{\sqrt{r_{yn}^H R_{xx}^{-1} r_{yn}}} = \frac{\sigma_y R_{xx}^{-1} r_{yn}}{\sqrt{d}}; \quad (7)$$

where d is introduced as a shortcut for the radicand. Eqns. (4)-(7) provide an estimate of $y_1$ as, $$\hat{y}_1 = \rho_{ys} s = \left(\frac{\hat{c} R_{xx}^{-1} r_{yn}}{\sigma_y \sqrt{\hat{c}^H R_{xx} \hat{c}}}\right)(\hat{c}^T x) \quad (8)$$

$$= \left(\frac{\sqrt{d}}{\sigma_y}\right)\left(\frac{\sigma_y r_{yn}^T R_{xx}^{-1}}{\sqrt{d}} x\right) = r_{yn}^T R_{xx}^{-1} x.$$

Eqn. (8) can be expanded to estimate a vector of points, y, using measured points, x, as follows:

$$\hat{y} = R_{yx} R_{xx}^{-1} x \quad (9);$$

where $R_{yx}$ is a covariance matrix of the covariances between each sampled point, $x_n$, and each point to be estimated, $y_m$, whose elements {m,n} are the covariance values, $E[y_m x_n^*]$; and $R_{xx}$ is a covariance matrix of the sampled data whose elements {m,n} are the covariance values, $E[x_m x_n^*]$.

For data collected in a particular scan, these covariances are generally calculated for every pair of coils $c_a$ (for a given $y_m$) and $c_b$ (for a given $x_n$) as a function of the distance in k-space from point m to point n. The covariance may include information from the coil sensitivities, the object being scanned, or any other source of covariance.

As one example, the covariances can be approximated from fully sampled images, $f_a$ and $f_b$, from coils $c_a$ and $c_b$, respectively. By way of example, the images, $f_a$ and $f_b$, can be low resolution images reconstructed from a central portion of k-space. To estimate the covariances, the image $f_a$ can be multiplied by the conjugate image $f_b^*$ and the result Fourier transformed, $$FT[f_a(x) f_b^*(x)] = \int F_a(k) F_b^*(k + dk) dk \quad (10)$$

$$\approx r_{ab}[dk].$$

This forms a matrix of covariance maps for each coil pair, which also includes object-induced covariance. Convolution in k-space by these maps and then resampling at locations corresponding to x or y is equivalent to multiplying a vector of data by $R_{xx}$ or $R_{xy}$, respectively. These covariance maps may be windowed before convolution.

Because of the inverse matrix in Eqn. (9), it is generally impractical to estimate the synthesized data, ŷ, directly, even with exact knowledge of $R_{xx}$ and $R_{xy}$. To overcome this limitation, an intermediate step can be performed to relax the computational burden of estimating the synthesized data. An intermediate parameter, z, can be defined via the following:

$$x = R_{xx} z \quad (11).$$

Using this parameter, the synthesized data can be estimated using a two-step process. First, Eqn. (11) can be solved using a linear algebra technique, such as the conjugate gradient method. In this example, to force the operating matrix to be positive semi-definite and to ensure convergence, Eqn. (11) can be rewritten as, $$R_{xx}^H x = R_{xx}^H R_{xx} z \quad (12);$$

where multiplication by $R_{xx}^H$ is achieved by flipping the convolution kernel used for $R_{xx}$ for each individual coil pair, but not taking its conjugate. That is, $r_{ab}[-dk]$ can be used. The values of the vector, z, correspond to the same corresponding k-space locations as those for the sampled data vector, x. This is used for the dk index of the convolution kernels, $r_{ab}$.

With an estimate of z, Eqn. (9) now becomes, $$\hat{y} = R_{yx} z \quad (13);$$

which is a simple convolution process from z (located at the sampled data locations) to the desired locations for y. The values for y can thus be defined on arbitrary trajectories, including possibly Cartesian k-space locations, which would obviate the need for regridding the data after this process.

Solving Eqn. (12) can be the most time-consuming part of the above-described methods. Assuming their are N coils for both y and x, their are $N^2$ convolutions that must be performed and $N^2$ convolution kernels that must be stored in memory. If their are also M data sets (e.g. for diffusion imaging or temporal imaging) over which correlations will be estimated, then the number of stored kernels and required convolutions becomes $(M*N)^2$, which can become computationally burdensome, particularly for 3D imaging. Note that the multiplication by the matrix $R_{xx}$ is implemented by convolution with a kernel rab, given in Eqn. (10). That is, for a given iteration between data sets (e.g. coils) a and b:

$$R_{xx} z \Leftrightarrow z \otimes r_{ab} \quad (14).$$

From Eqn. (10), $r_{ab}$ can be substituted with the Fourier transforms of $f_a(x)$ and $f_b^*(x)$. That is, $$R_{xx} z \Leftrightarrow z \otimes [F_b^*(-k) \otimes F_a(k)] \quad (15).$$

The vector, z, can then be broken into the constituent set b, and Eqn. (15) can be rearranged as:

$$R_{xx} z \Leftrightarrow \sum_b z_b \otimes [F_b^*(-k) \otimes F_a(k)] = \left[\sum_b z_b \otimes F_b^*(-k)\right] \otimes F_a(k). \quad (16)$$

The convolution in square brackets of Eqn. (16) is performed for all M*N sets, and can be stored (i.e. convolved onto) a sufficiently dense Cartesian grid. The second M*N convolutions (with $F_a$) can then be performed off of this single Cartesian grid, for a complete process that requires only 2*M*N convolutions and requires storage of M*N kernels (instead of the original $[M*N]^2$ kernels and convolutions required).

Referring now to FIG. 1, a flowchart is illustrated as setting forth the steps of an example method for estimating synthesized data and reconstructing an image of a subject using an MRI system. The method includes acquiring data from the subject using multiple receive coils, such as an array of receive coils, as indicated at step 102. Preferably, the acquired data are undersampled. As one example, the data can be acquired using a variable density spiral pulse sequence that fully samples the middle of k-space (e.g., the central ten percent of k-space) and radially undersamples k-space outside of this region. It will be appreciated, however, that the data can be acquired using an arbitrary sampling trajectory, whether Cartesian or non-Cartesian.

An example of a variable density spiral trajectory includes radial data undersampling that begins at a k-space radius equal to ten percent of the maximum radius; increases to some value, K, at thirty percent of the maximum radius; and then remains constant at K for the remainder of k-space sampling.

After the data are acquired, low-resolution images are reconstructed from the acquired data, as indicated at step 104. For instance, low-resolution images are reconstructed from the central portion of k-space, which in the variable density spiral acquisition corresponds to a fully sampled region of k-space.

Covariance maps are then estimated from the low-resolution images, as indicated at step 106. In one example, the covariance maps are estimated based on pairwise multiplication of the low-resolution images corresponding to pairs of receive coils, as described above. For instance, the low-resolution image, $f_a$, associated with a first coil, $c_a$, is multiplied with the conjugate of the low-resolution image, $f_b^*$, associated with a second coil, $c_b$. The resulting product, $f_a f_b^*$, is then Fourier transformed to obtain the estimate of the covariance maps, $r_{ab}[dk]$.

In some embodiments, the covariance maps are cropped to a desired convolution radius and then windowed, such as by using a Hanning window. This windowing of $r_{ab}$ appears to advantageously stabilize the solution to Eqn. (10). To understand this stabilization, multiplying by $R_{xx}^{-1}$ can be viewed as equivalent to deconvolving by $r_{ab}$ in k-space, which is in turn the same as dividing by its Fourier transform, $R_{ab}$, in image space. To keep $R_{ab}$ from have zero-crossings in the image, $r_{ab}$ can be windowed as described above.

A desired sampling pattern for the synthesized data, y, is provided, selected, or otherwise computed, as indicated at step 108. As mentioned above, the sampling pattern for the synthesized data can be any arbitrary sampling pattern, whether Cartesian or non-Cartesian. As one example, from the region where undersampling starts in a variable density spiral acquisition (e.g., ten percent maximum radius) to the edge, coordinates for y can be generated as spiral trajectories matching those used for data measurement, but rotated to be equally spaced between the measured arms of x. The number of y arms between each pair of x arms is equal to the ceiling of K−1, where the ceiling function is used should K be a non-integer value, so that the radial spacing of the data including both y and x meets or exceeds the Nyquist sampling constraint of 1/FOV.

In some embodiments, the synthesized data can be defined on a Cartesian grid, obviating the need for subsequent gridding prior to image formation. The synthesized data can also be defined on a single, potentially homogenous, receive coil. This latter embodiment would obviate the need for subsequent coil combination and reducing the gridding operation to a single data set prior to image formation.

The synthesized data are estimated next, as indicated at step 110. As described above, the synthesized data can be estimated in a two-step process. First, the covariances computed between the measured data are utilized in Eqn. (11) or (12) to estimate an intermediate vector, z. Eqn. (13) can then be used to convolve this intermediate vector, z, to the provided sampling pattern for the synthesized data, y, which thus estimates the synthesized data. As mentioned above, in some embodiments, the measured and synthesized data can be on the same or different coils, which in turn can be real or virtual.

Based at least on the synthesized data, y, an image of the subject is then reconstructed, as indicated at step 112. In some embodiments, the image can be reconstructed from the synthesized data, y, alone. In some other embodiments, however, the image can be reconstructed from a combination of the measured data, x, and the synthesized data, y.

In some embodiments, the systems and methods described here can be used in any dimensionality, including space, time, and frequency, where covariances can be estimated.

The systems and methods described here can be incorporated with other encoding that affects covariance. For example, the phase imposed from motion during the application of diffusion weighting gradients can be incorporated into the algorithm described here.

Figure 2:
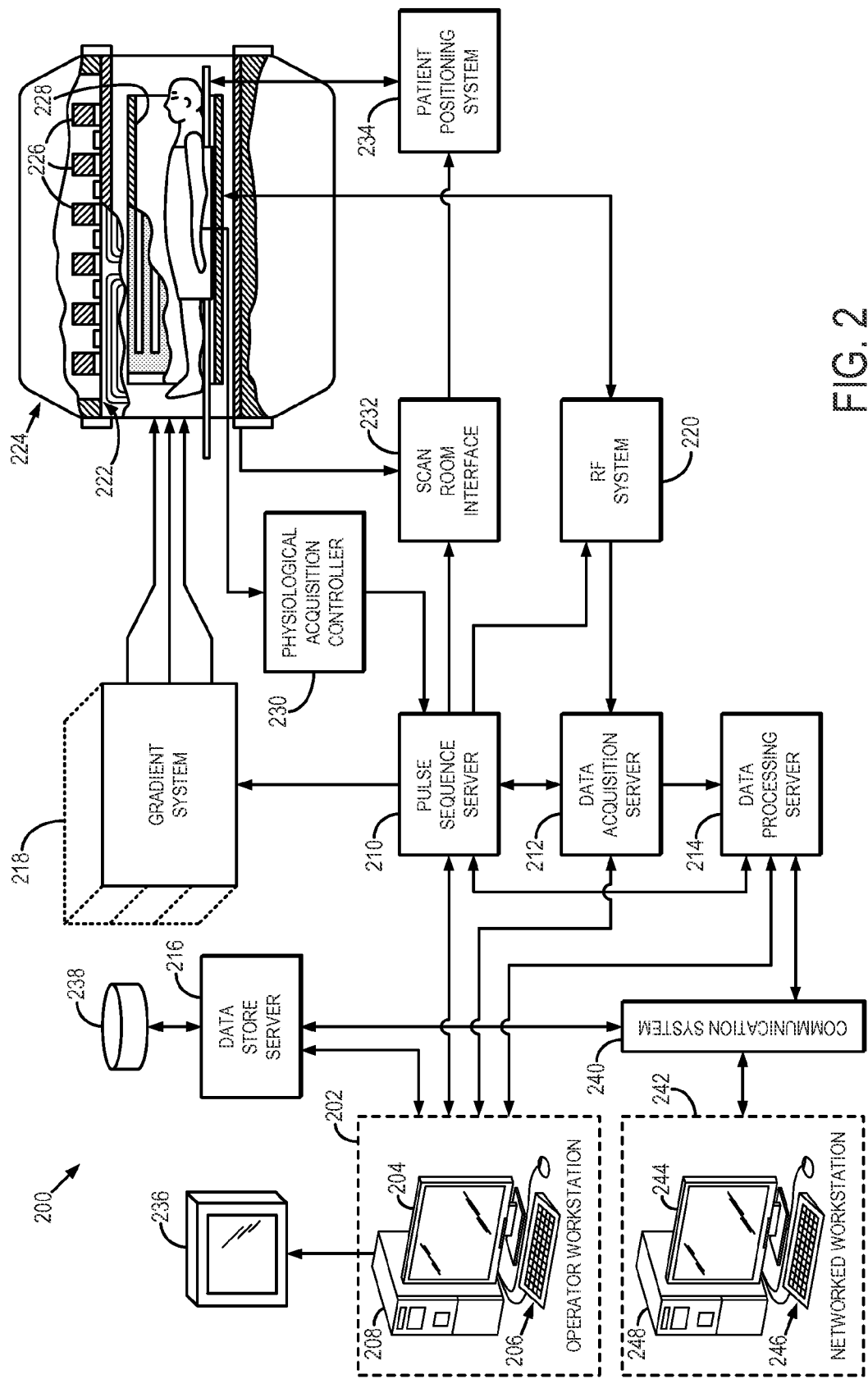
FIG. 2 is a block diagram of an example of an MRI system configured in accordance with the present disclosure.

Referring particularly now to FIG. 2, an example of a magnetic resonance imaging ("MRI") system 200 is illustrated. The MRI system 200 includes an operator workstation 202, which will typically include a display 204; one or more input devices 206, such as a keyboard and mouse; and a processor 208. The processor 208 may include a commercially available programmable machine running a commercially available operating system. The operator workstation 202 provides the operator interface that enables scan prescriptions to be entered into the MRI system 200. In general, the operator workstation 202 may be coupled to four servers: a pulse sequence server 210; a data acquisition server 212; a data processing server 214; and a data store server 216. The operator workstation 202 and each server 210, 212, 214, and 216 are connected to communicate with each other. For example, the servers 210, 212, 214, and 216 may be connected via a communication system 240, which may include any suitable network connection, whether wired, wireless, or a combination of both. As an example, the communication system 240 may include both proprietary or dedicated networks, as well as open networks, such as the internet.

The pulse sequence server 210 functions in response to instructions downloaded from the operator workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil (not shown in FIG. 2), in order to perform the prescribed magnetic resonance pulse sequence. Responsive magnetic resonance signals detected by the RF coil 228, or a separate local coil (not shown in FIG. 2), are received by the RF system 220, where they are amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the scan prescription and direction from the pulse sequence server 210 to produce RF pulses of the desired frequency, phase, and pulse amplitude waveform. The generated RF pulses may be applied to the whole-body RF coil 228 or to one or more local coils or coil arrays (not shown in FIG. 2).

The RF system 220 also includes one or more RF receiver channels. Each RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (14);$$

and the phase of the received magnetic resonance signal may also be determined according to the following relationship:

$$\varphi = \tan^{-1}\left(\frac{Q}{I}\right). \quad (15)$$

The pulse sequence server 210 also optionally receives patient data from a physiological acquisition controller 230. By way of example, the physiological acquisition controller 230 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, such that no data is lost by data overrun. In some scans, the data acquisition server 212 does little more than pass the acquired magnetic resonance data to the data processor server 214. However, in scans that require information derived from acquired magnetic resonance data to control the further performance of the scan, the data acquisition server 212 is programmed to produce such information and convey it to the pulse sequence server 210. For example, during prescans, magnetic resonance data is acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also be employed to process magnetic resonance signals used to detect the arrival of a contrast agent in a magnetic resonance angiography ("MRA") scan. By way of example, the data acquisition server 212 acquires magnetic resonance data and processes it in real-time to produce information that is used to control the scan.

The data processing server 214 receives magnetic resonance data from the data acquisition server 212 and processes it in accordance with instructions downloaded from the operator workstation 202. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 214 are conveyed back to the operator workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the operator workstation 202. The operator workstation 202 may be used by an operator to archive the images, produce films, or send the images via a network to other facilities.

The MRI system 200 may also include one or more networked workstations 242. By way of example, a networked workstation 242 may include a display 244; one or more input devices 246, such as a keyboard and mouse; and a processor 248. The networked workstation 242 may be located within the same facility as the operator workstation 202, or in a different facility, such as a different healthcare institution or clinic.

The networked workstation 242, whether within the same facility or in a different facility as the operator workstation 202, may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may be exchanged between the data processing server 214 or the data store server 216 and the networked workstations 242, such that the data or images may be remotely processed by a networked workstation 242. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject using a magnetic resonance imaging (MRI) system, the steps of the method comprising:
   (a) directing the MRI system to acquire data from the subject using multiple receive coils;
   (b) producing covariance maps that define covariances of the acquired data as a function of differences of k-space locations between pairs of the multiple receive coils;

(c) estimating intermediate data using the acquired data and the produced covariance maps;
(d) selecting a desired k-space sampling pattern;
(e) producing synthesized data on the selected k-space sampling pattern by convolving the intermediate data with the covariance maps; and
(f) reconstructing an image of the subject from at least the synthesized data.

2. The method as recited in claim 1, wherein step (f) includes producing combined data by combining the synthesized data with the acquired data and reconstructing the image of the subject from the combined data.

3. The method as recited in claim 1, wherein step (b) includes producing the covariance maps from the acquired data.

4. The method as recited in claim 3, wherein step (b) includes reconstructing low-resolution images from the acquired data and estimating the covariance maps from the low-resolution images.

5. The method as recited in claim 4, wherein estimating the covariance maps includes Fourier transforming a product calculated by multiplying a low-resolution image associated with a first receive coil with a conjugate of a low-resolution image associated with a second receive coil.

6. The method as recited in claim 1, wherein step (b) includes producing the covariance maps from coil sensitivity maps associated with the multiple receive coils.

7. The method as recited in claim 1, wherein step (b) includes directing the MRI system to acquire additional data, and the covariance maps are produced from the additional data.

8. The method as recited in claim 1, wherein step (c) includes estimating the intermediate data according to, $x=R_{xx}z$, wherein x is the acquired data, $R_{xx}$ is a matrix defined by the covariance maps, and z is the intermediate data.

9. The method as recited in claim 8, wherein the intermediate data are estimated using a conjugate gradient method.

10. The method as recited in claim 1, wherein the acquired data are acquired using a non-Cartesian acquisition.

11. The method as recited in claim 10, wherein the non-Cartesian acquisition includes sampling k-space using a variable density spiral trajectory.

12. The method as recited in claim 11, wherein the k-space sampling pattern selected in step (d) includes spiral trajectories that are interleaved with the variable density spiral trajectory used to acquire data in step (a).

13. The method as recited in claim 1, wherein the k-space sampling pattern selected in step (d) includes a Cartesian grid pattern.

14. The method as recited in claim 1, wherein the synthesized data are estimated in step (e) for different coils than the acquired data.

15. A magnetic resonance imaging (MRI) system comprising:

a magnet system configured to generate a polarizing magnetic field about at least a portion of a subject arranged in the MRI system;
a plurality of gradient coils configured to apply a gradient field to the polarizing magnetic field;
a radio frequency (RF) system configured to apply an excitation field to the subject and acquire MR image data from a ROI;
a computer system programmed to:
    control the plurality of gradient coils and RF system to acquire data from the subject using multiple receive coils;
    produce covariance maps that define covariances of the acquired data as a function of differences of k-space locations between pairs of the multiple receive coils;
    estimate intermediate data using the acquired data and the produced covariance maps;
    select a desired k-space sampling pattern;
    produce synthesized data on the selected k-space sampling pattern by convolving the intermediate data with the covariance maps; and
    reconstruct an image of the subject from at least the synthesized data.

16. The system as recited in claim 15, wherein the computer system is further programmed to combine the synthesized data with the acquired data to form combined data and reconstruct the image of the subject from the combined data.

17. The system as recited in claim 15, wherein the computer system is further programmed to produce the covariance maps from the acquired data, reconstruct low-resolution images from the acquired data, estimate the covariance maps from the low-resolution images.

18. The system as recited in claim 17, wherein to estimate the covariance maps, the computer system is further programmed to perform a Fourier transform on a product calculated by multiplying a low-resolution image associated with a first receive coil with a conjugate of a low-resolution image associated with a second receive coil.

19. The system as recited in claim 15, wherein the computer system is further programmed to produce the covariance maps from coil sensitivity maps associated with the multiple receive coils.

20. The system as recited in claim 15, wherein the computer is further programmed to estimate the intermediate data according to, $x=R_{xx}z$, wherein x is the acquired data, $R_{xx}$ is a matrix defined by the covariance maps, and z is the intermediate data.

21. The system as recited in claim 15, wherein the computer is further programmed to use a non-Cartesian acquisition to acquire the acquired data.

22. The system as recited in claim 15, wherein the computer is further programmed to control the plurality of gradient coils and RF system to acquire data from the subject using multiple receive coils using a parallel imaging process.

* * * * *